US006992337B2

(12) United States Patent
Bahl et al.

(10) Patent No.: US 6,992,337 B2
(45) Date of Patent: Jan. 31, 2006

(54) GALLIUM ARSENIDE ANTIMONIDE (GAASSB)/INDIUM PHOSPHIDE (INP) HETEROJUNCTION BIPOLAR TRANSISTOR (HBT) HAVING REDUCED TUNNELING PROBABILITY

(75) Inventors: Sandeep Bahl, Palo Alto, CA (US); Nicolas J. Moll, Woodside, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/817,514

(22) Filed: Apr. 2, 2004

(65) Prior Publication Data

US 2005/0218428 A1 Oct. 6, 2005

(51) Int. Cl.
*H01L 27/0328* (2006.01)
(52) U.S. Cl. .................. 257/194; 257/194; 257/195; 257/197
(58) Field of Classification Search .............. 257/85, 257/94, 96, 183, 187, 189–191, 197–198, 257/194
See application file for complete search history.

(56) References Cited

U.S. PATENT DOCUMENTS

| 4,670,767 A | 6/1987 | Ohta |
| 6,670,653 B1 | 12/2003 | Micovic et al. |
| 2002/0070390 A1 | 6/2002 | Chow |
| 2002/0088993 A1 | 7/2002 | Twynam et al. |
| 2004/0149994 A1 * | 8/2004 | Yi et al. ............. 257/79 |
| 2004/0227155 A1 * | 11/2004 | Hase ................ 257/197 |

FOREIGN PATENT DOCUMENTS

| EP | 0 313 749 | 8/1988 |
| JP | 05304165 | 11/1993 |
| JP | 05326546 | 12/2003 |
| JP | 2004207583 | 7/2004 |

OTHER PUBLICATIONS

Otfried Madelung, "Semiconductors—Basic Data," Springer-Verlag, Berlin, 1996.*
I. Vurgaftman, et al., Band Parameters For III-V Compound Semiconductors and Their Alloys, *Journal of Applied Physics*, vol. 89, No. 11, (2001) (5815-5875).
N. Matine, et al., Nearly Ideal InP/GaAsSb/InP Double Heterojunction Bipolar Transistors With Ballistically Launched Collector Electrons, *Electronics Letters* (1998), vol. 34, No. 17 (1700-1702).
M. Ida, et al., InP/GaAs DHBTs With 341-GHz $f_T$ At High Current Density of Over 800 kA/cm$^2$, 2001 IEEE, (35.4.1-35.4.4).
S.S. Yi, et al., Growth and Device Performance of InP/GaAsSb HBTS, *2003 IEEE*, (380-384).
C.R. Bolognesi, et al., Breakdown Voltage Limitations, Impact Ionization, and Interband Tunneling in InP/GaAsSb/InP Type-II NpN DHBTs, 2003 IEEE, (4 pages).
S.P. McAlister, et al., Improvement of $f_T$ by Dipole Doping at the Collector Heterojunction in InP Double HBTs, *Electronics Letters* (1997), vol. 33, No. 11 (991-993).
InGaAs/InP Double-Heterostructure Bipolar Transistors With Near -Ideal β Versus $I_c$ Characteristic, Nottenburg et al., *IEEE Electron Device Letters*, vol. EDL-7, No. 11, pp 643-645, 1986.

* cited by examiner

*Primary Examiner*—Minhloan Tran
*Assistant Examiner*—Thomas L. Dickey (57) ABSTRACT

A heterojunction bipolar transistor (HBT), comprises a collector formed over a substrate, a base formed over the collector, an emitter formed over the base, and a tunneling suppression layer between the collector and the base, the tunneling suppression layer fabricated from a material that is different from a material of the base and that has an electron affinity equal to or greater than an electron affinity of the material of the base.

13 Claims, 6 Drawing Sheets

GALLIUM ARSENIDE ANTIMONIDE (GAASSB)/INDIUM PHOSPHIDE (INP) HETEROJUNCTION BIPOLAR TRANSISTOR (HBT) HAVING REDUCED TUNNELING PROBABILITY

BACKGROUND OF THE INVENTION

An indium phosphide (InP)-based heterojunction bipolar transistor (HBT) is useful in applications where high-frequency operation and relatively high breakdown voltage, on the order of 10 to 20 volts, is desirable. The approximate relationship $f_{MAX} = \sqrt{f_T / 8\pi R_b C_c}$, where $f_T$ is the current-gain-bandwidth product, or cutoff frequency, $R_b$ is the base series resistance and $C_c$ is the collector-base capacitance, shows that as $f_T$ increases, the maximum operating frequency $f_{MAX}$ increases. The relationship is approximate because it is based on a simple lumped-element model of the transistor. Actually, the base series resistance $R_b$ and collector-base capacitance $C_c$ are distributed. More accurate expressions are algebraically complex and would obscure, rather than illuminate, the points that this approximate expression is used to make.

The breakdown voltage of a p-n junction is the reverse voltage beyond which a small increase in voltage causes a large increase in current. There are two definitions of breakdown voltage in a bipolar transistor. The voltage $BV_{CEO}$ is the transistor breakdown voltage measured with the base terminal open. The voltage $BV_{CBO}$ is the breakdown voltage of the base-collector junction measured with the emitter terminal open. In an indium phosphide (InP) HBT with gallium arsenide antimonide (GaAsSb) as the base material, $BV_{CBO}$ is limited by what is referred to as the "Zener" tunneling of electrons from the valence band of the base to the conduction band of the collector of the HBT. The current thereby produced is referred to as the "tunneling current." It is generally desirable to maximize the voltage at which this tunneling current flows.

A GaAsSb/InP HBT exhibits superior high-frequency (high $f_T$ and $f_{MAX}$) performance. The GaAsSb base forms what is referred to as a "type-II" band lineup with the InP collector. The band lineup is ideal in many respects because the conduction band offset improves electron transport from the base to the collector and the valence band offset minimizes hole transport from the base to the collector. The type-II band lineup leads to a desirable "knee" turn-on characteristic of the HBT. A good knee turn-on characteristic allows operation at a relatively low collector voltage and is important for the efficient operation of many circuits into which the HBT will be incorporated.

GaAsSb/InP HBTs have the above-described advantages but also a breakdown voltage insufficient for a number of potential applications. What is needed therefore is a GaAsSb/InP HBT with the above-described advantages, but with an increased breakdown voltage.

SUMMARY OF THE INVENTION

The invention provides a heterojunction bipolar transistor (HBT), comprising a collector formed over a substrate, a base formed over the collector, an emitter formed over the base, and a tunneling suppression layer between the collector and the base. The tunneling suppression layer is fabricated from a material different from the material of the base and that has an electron affinity equal to or greater than an electron affinity of the material of the base.

The invention additionally provides a method of making an HBT comprising providing a substrate, forming a subcollector over the substrate, forming a collector over the subcollector, forming a tunneling suppression layer over the collector, forming a base over the tunneling suppression layer and forming an emitter over the base.

The tunneling suppression layer increases the breakdown voltage of an HBT by decreasing the probability of electrons tunneling from the valence band of the base to the conduction band of the collector.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
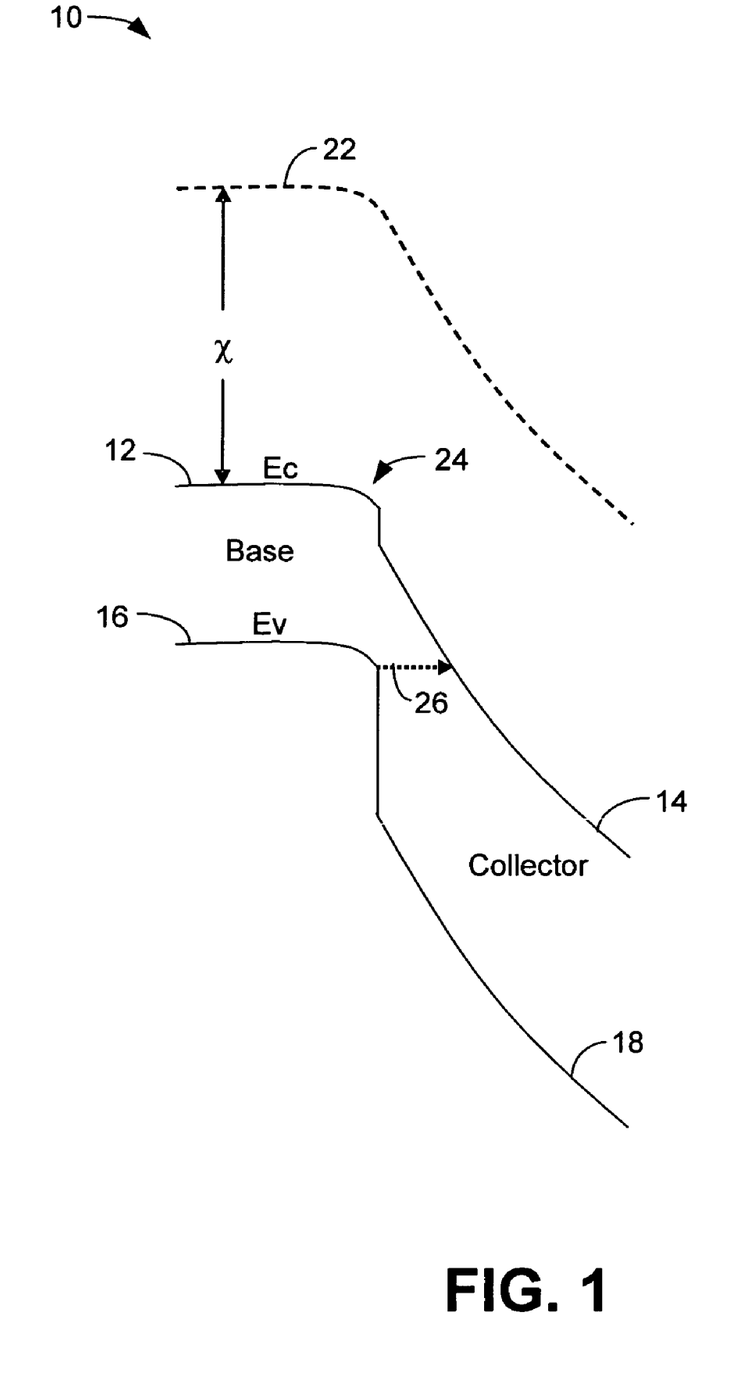
FIG. 1 is a band diagram of the base-collector junction of a GaAsSb/InP HBT under reverse bias.

A band diagram 10 for the base-collector junction of an HBT having a GaAsSb base and an InP collector is shown in FIG. 1 and shows a type-II band lineup. The band diagram 10 plots electron energy against physical distance in the direction orthogonal to the plane of the layers of the device. The band diagram 10 shows the conduction band energy, Ec, (12 for the base and 14 for the collector) the valence band energy Ev, (16 for the base and 18 for the collector) and the vacuum level 22 under reverse bias. The vacuum level is a reference defining the energy of a free electron. The electron affinity, $\chi$ (chi), is the difference in energy between the vacuum level 22 and the conduction band energy, Ec, of a semiconductor. The electron affinity, $\chi$, is the energy needed to free an electron present in the conduction band of a semiconductor. Since the vacuum level is continuous, the conduction band offset is the difference in the electron affinity between two semiconductors.

The band lineup of a GaAsSb/InP HBT, while encouraging electron transport, is unfavorable since it increases the probability of electrons tunneling from the valence band of the base into the conduction band of the collector. The tunneling probability is increased because the distance between the valence band of the base and the conduction band of the collector is relatively short, as illustrated by arrow 26 in FIG. 1. Increasing the tunneling probability will reduce the breakdown voltage, $BV_{CBO}$. In addition to the tunneling distance, the tunneling probability is also dependent upon several other factors, such as the energy barrier at the base-collector junction, the electron and hole mass in the energy barrier, and the density of states available for tunneling.

Figure 2:
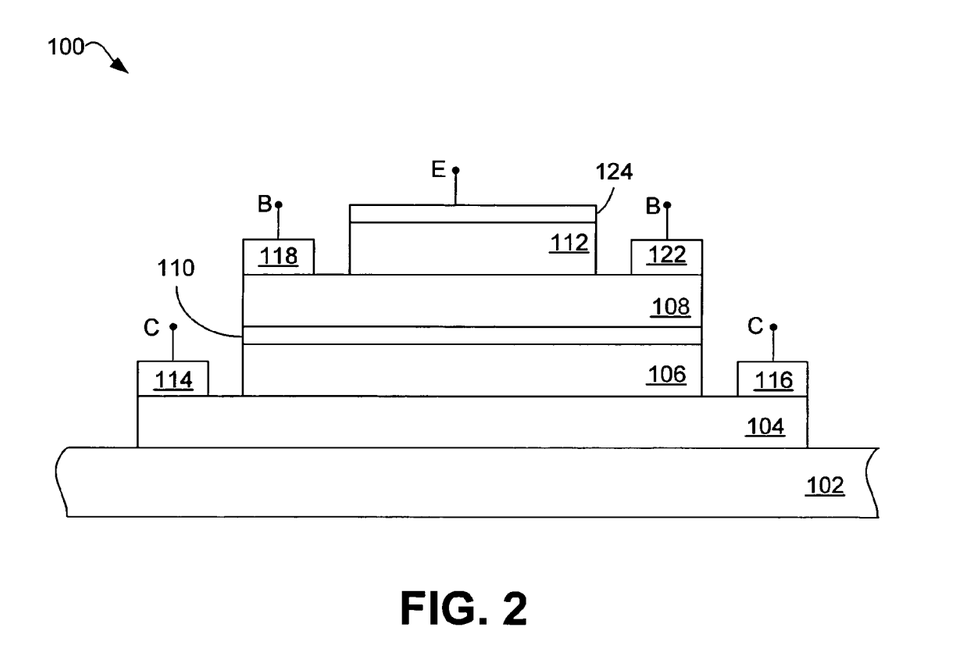
FIG. 2 is a block diagram illustrating a heterojunction bipolar transistor (HBT) constructed in accordance with an embodiment of the invention.

FIG. 2 is a block diagram illustrating a heterojunction bipolar transistor (HBT) 100 constructed in accordance with an embodiment of the invention. The HBT 100 can be formed using various semiconductor material systems. In this example, the semiconductor layers of the HBT are grown on an indium phosphide (InP) substrate 102. A layer of indium phosphide approximately 500 nanometers (nm) thick is grown over the indium phosphide substrate 102 and forms the subcollector 104. A layer of indium phosphide approximately 300 nm thick is grown over the subcollector 104 and forms the collector 106.

A tunneling suppression layer 110 is grown over the collector 106. The tunneling suppression layer 110 is fabricated of a material containing two or more of the elements aluminum, gallium, indium, nitrogen, phosphorous, arsenic and antimony. For example, the tunneling suppression layer 110 can be fabricated using aluminum gallium indium arsenide (AlGaInAs) or aluminum indium arsenide phosphide (AlInAsP). In one embodiment, the tunneling suppression layer 110 is formed using AlGaInAs having the composition $Al_{0.33}Ga_{0.15}In_{0.52}As$. Other compositions can be used depending on the desired characteristics of the HBT 100. For example, composition of the AlGaInAs can be $Al_{1-x-y}Ga_xIn_yAs$, where $0.09 \leq x \leq 0.25$, and $y=0.52$. The tunneling suppression layer 110 is grown to a thickness of approximately 10 to 50 nm, and is typically about 25 nm thick.

A layer of gallium arsenide antimonide (GaAsSb) approximately 30 nm thick is grown over the tunneling suppression layer 110 and forms the base 108. A layer of indium phosphide approximately 100 nm thick is formed over the base 108 and forms the emitter 112. The emitter can also be formed from other materials, such as aluminum indium arsenide (AlInAs), aluminum gallium indium arsenide (AlGaInAs), aluminum indium arsenide phosphide (AlInAsP) or another composition containing two or more of the elements aluminum, gallium, indium, nitrogen, phosphorous, arsenic and antimony. Collector contacts 114 and 116, base contacts 118 and 122, and emitter contact 124 are then formed on the subcollector 104, base 108 and emitter 112, respectively, after etching down to those respective layers.

The tunneling suppression layer 110 is formed from a material different than the material from which the base 108 is formed. Furthermore, as will be described below, the electron affinity, $\chi$, of the material from which the tunneling suppression layer 110 is formed is equal to or greater than the electron affinity of the material from which the base 108 is formed. An electron affinity difference between the material from which the tunneling suppression layer 110 is formed and the material from which the base 108 is formed can be, for example, on the order of 0.03 eV and still be considered to be equal. In this example, the composition of the aluminum gallium indium arsenide material of the tunneling suppression layer 110 is chosen to have an electron affinity, $\chi$, equal to or greater than the electron affinity of the gallium arsenide antimonide material of the base 108.

Figure 3:
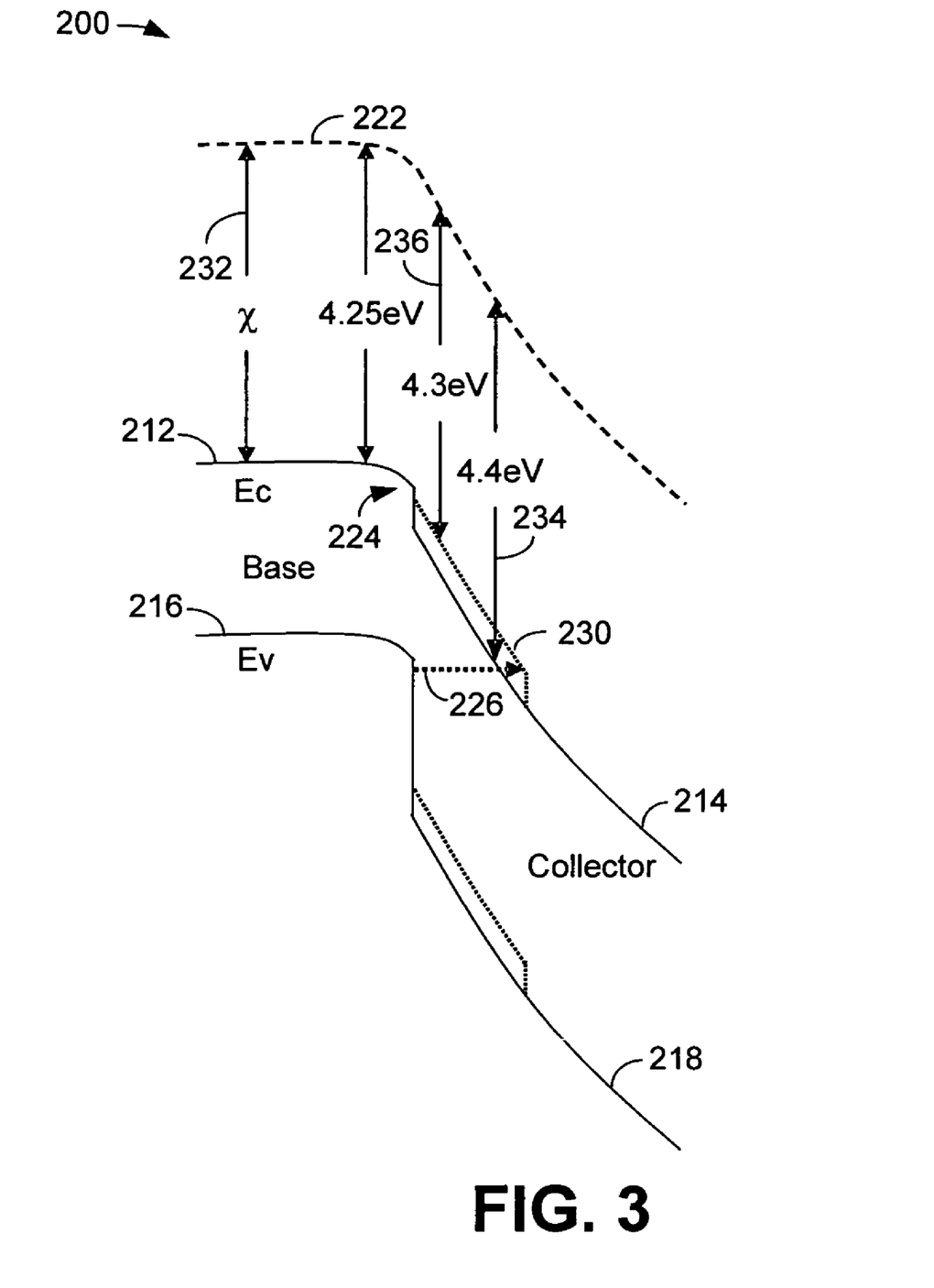
FIG. 3 is a band diagram of the base-collector junction of a gallium arsenide antimonide/indium phosphide HBT, including the tunneling suppression layer of FIG. 2, under reverse bias.

FIG. 3 is a band diagram 200 of the base-collector junction of a gallium arsenide antimonide/indium phosphide HBT, including the tunneling suppression layer of FIG. 2, under reverse bias. As mentioned above, the band diagram 200 plots electron energy against distance. The vacuum level is indicated at 222, the energy level of the conduction band in the base is indicated using reference numeral 212, and the energy level of the conduction band in the collector is indicated using reference numeral 214. The energy level of the valence band in the base is indicated using reference numeral 216 and the energy level of the valence band in the collector is indicated using reference numeral 218. The electron affinity, $\chi$, is indicated using numeral 232. The electron affinity, $\chi$, of an electron in a GaAsSb base is about 4.25 eV.

In accordance with an embodiment of the invention, locating the tunneling suppression layer 110 between the collector 106 and the base 108 of the HBT 100 as shown in FIG. 2, increases the distance through which an electron must tunnel from the valence band of the base to the conduction band of the collector. This distance is shown by arrow 226, and represents an increase in the tunneling distance through which an electron must travel when compared to an HBT without the tunneling suppression layer. The dotted line 230 shows the conduction band energy of the tunneling suppression layer 110. For reference, the dotted line 230 is shown overlaid on the conduction band energy 214 of a collector without a tunneling suppression layer. The electron affinity, $\chi$, of the tunneling suppression layer is shown using arrow 236, which, in this example, is about 4.3 eV. For reference, the electron affinity, $\chi$, of an electron in the conduction band of an InP collector is shown using arrow 234, which indicates an electron affinity of 4.4 eV.

The tunneling suppression layer 110 increases the reverse (breakdown) voltage of the HBT 100 by reducing the probability that an electron will tunnel from the valence band of the base to the conduction band of the collector. Effectively, the distance through which an electron must tunnel from the valence band of the base to the conduction band of the collector is increased as shown by arrow 226. Because the electron affinity of the tunneling suppression layer 110 is substantially equal to or greater than the electron affinity of the base, the tunneling suppression layer 110 does not impede the desirable conduction band flow of electrons from the base to the collector. Thus, the desirable "knee" turn on characteristic of the HBT 100 is maintained and the HBT 100 exhibits high current flow at low voltage.

The electron affinity, $\chi$, at the junction 224 of the base and the tunneling suppression layer 110 is slightly offset to reduce the barrier (i.e., provide additional energy) to electrons moving from the base to the collector via the conductor band.

Offsetting the effect of introducing a tunneling suppression layer 110 is that most of the commonly available material compositions for the tunneling suppression layer 110 (aluminum gallium indium arsenide or aluminum indium arsenide phosphide) have either one or both of a lower effective mass for electron tunneling and a smaller hole tunneling barrier (valence band offset) than indium phosphide. Both of these effects will act to increase the tunneling probability and thereby reduce the breakdown voltage. These effects create a tradeoff with the increased tunneling distance provided by the tunneling suppression layer 110. Simulation studies were performed to assist in the design of the tunneling suppression layer 110 and to verify the decrease in tunneling probability. Simulation results show that a tunneling suppression layer 110 reduces the collector current, and thereby reduces the tunneling probability in an HBT for a given collector-base voltage.

Figure 4:
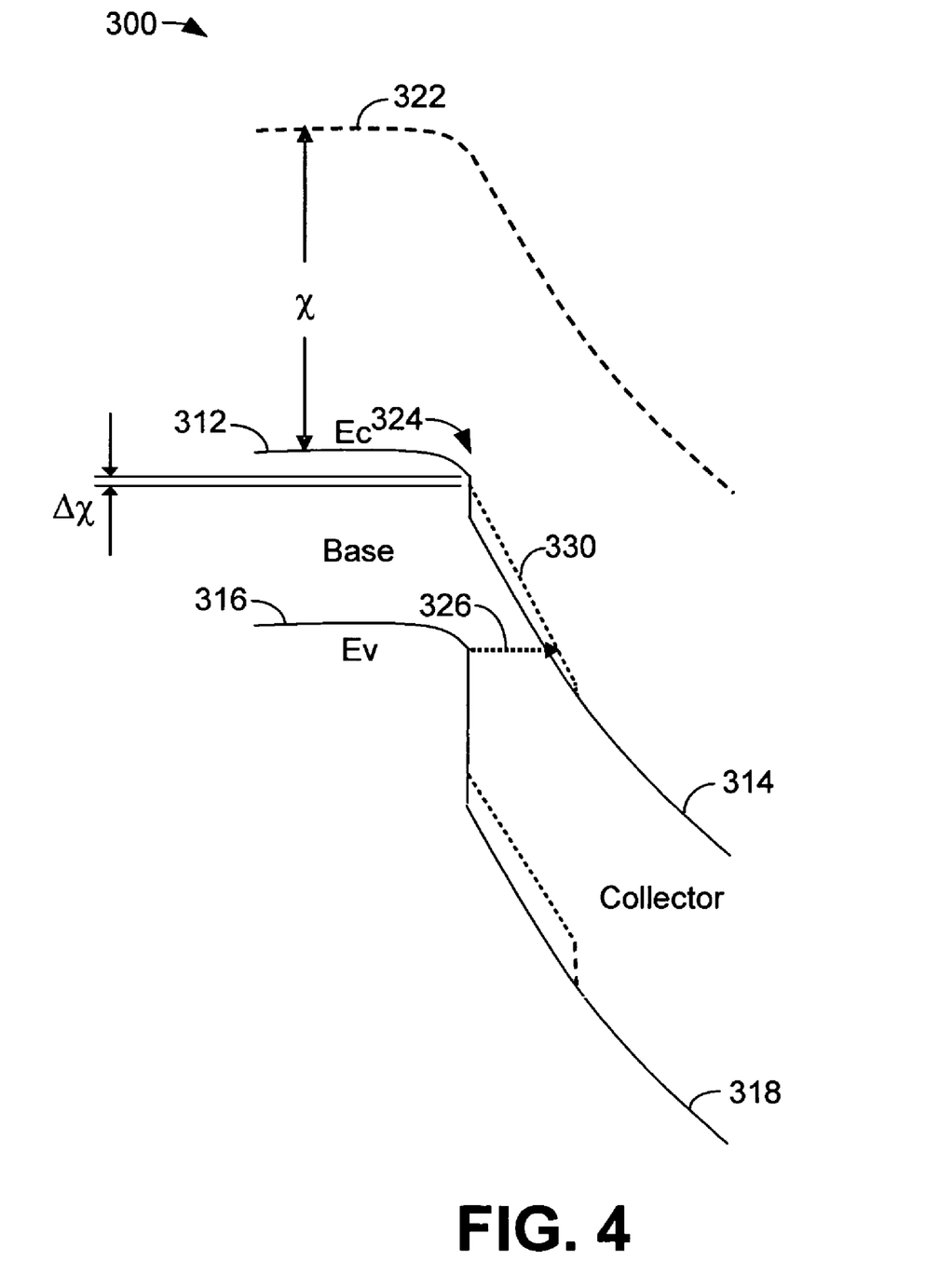
FIG. 4 is a band diagram of the base-collector junction of a gallium arsenide antimonide/indium phosphide HBT, including an alternative embodiment of the tunneling suppression layer of FIG. 2, under reverse bias.

FIG. 4 is a band diagram 300 of the base-collector junction of a gallium arsenide antimonide/indium phosphide HBT, including an alternative embodiment of the tunneling suppression layer of FIG. 2, under reverse bias. The tunneling suppression layer in FIG. 4 has a graded electron affinity, $\chi$. The dotted line 330 illustrates a tunneling suppression layer 110 that has a graded electron affinity, $\chi$, that varies with the distance that an electron travels into the tunneling suppression layer. The step 324 in electron affinity from the base to the tunneling suppression layer 110 is represented by $\Delta\chi$ and the increase in electron affinity across the tunneling suppression layer 110 is represented by $\Delta\chi^r$ in FIG. 5B. The electron affinity, $\chi$, near the junction 324 of the base and the tunneling suppression layer 110 is slightly offset to reduce the barrier to electrons moving from the base to the collector via the conduction band. By changing the composition of the aluminium gallium indium arsenide tunneling suppression layer over the depth of the layer, a graded tunneling suppression layer is formed that provides the desirable low knee voltage and also reduces tunneling current.

Figure 5A:
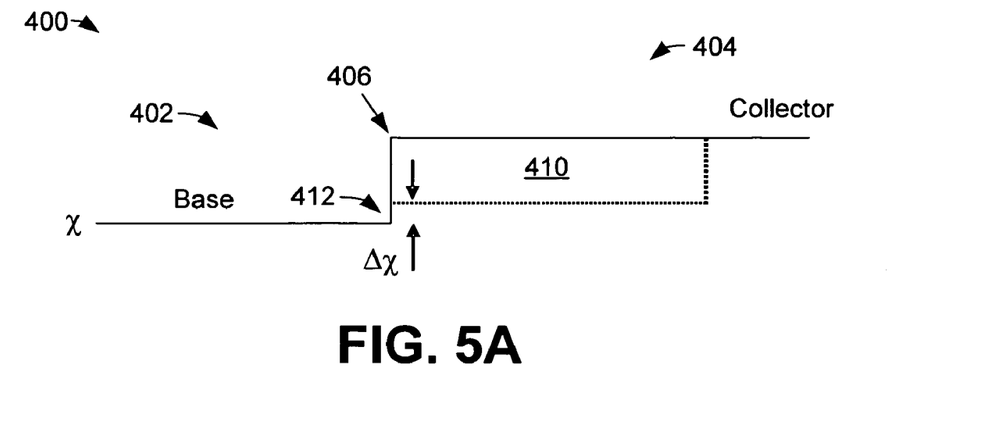
FIG. 5A is a schematic diagram illustrating a tunneling suppression layer having a constant electron affinity as shown in FIG. 3.

FIG. 5A is a schematic diagram 400 illustrating the electron affinity of a tunneling suppression layer having a constant electron affinity, $\chi$, as shown in FIG. 3. The electron affinity, $\chi$, of the tunneling suppression layer 410 at the junction 412 of the base 402 and the tunneling suppression layer 410 is slightly offset by $\Delta\chi$ to reduce the barrier to electrons moving from the base to the collector via the conduction band. The electron affinity of the tunneling suppression layer 410 remains constant toward the collector 404. In this example, a composition of approximately $Al_{0.33}Ga_{0.15}In_{0.52}As$ provides a $\Delta\chi$ of approximately 0.07 eV. Alternatively, a composition of up to approximately $Al_{0.37}Ga_{0.11}In_{0.52}As$ having the same electron affinity, $\chi$, as a GaAsSb base may be used at the expense of an increased barrier to electrons moving from the base to the collector via the conduction band.

Figure 5B:
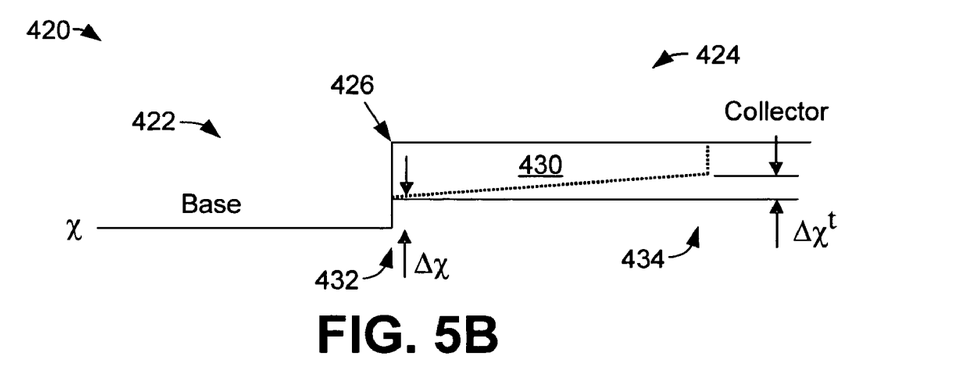
FIG. 5B is a schematic diagram illustrating a tunneling suppression layer having an electron affinity that varies with depth.

FIG. 5B is a schematic diagram 420 illustrating the electron affinity of a tunneling suppression layer having an electron affinity, $\chi$, that varies with the depth of the tunneling suppression layer 110. The variation in electron affinity may be realized by using a tunneling suppression layer 430 comprising $Al_{1-x-y}Ga_xIn_yAs$, where $0.09 \leq x \leq 0.25$, and y=0.52, and having a greater gallium mole-fraction near the collector than near the base. For example, varying x from approximately 0.12 at the base side of the tunneling suppression layer to approximately 0.15 at the collector side of the tunneling suppression layer results in a $\Delta\chi$ of approximately 0.03 eV in a region 432 near the base 422 and a $\Delta\chi^r$ of approximately 0.04 eV. In this example, the $\Delta\chi$ in the region 432 near the base 422 provides a reduced barrier to electrons moving from the base to the collector via the conductor band, and the grade provides extra energy to these electrons while traversing the tunneling suppression layer 430. The grade of the tunneling suppression layer 430 corresponds to the dotted line 330 in the band diagram of FIG. 4.

Figure 5C:
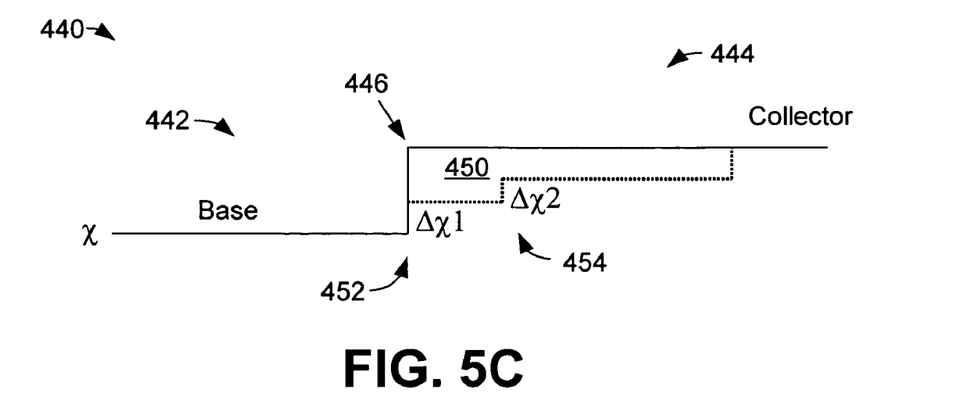
FIG. 5C is a schematic diagram illustrating a tunneling suppression layer having a stepwise-varying electron affinity.

FIG. 5C is a schematic diagram 440 illustrating a tunneling suppression layer having a step-wise graded electron affinity. The electron affinity of the tunneling suppression layer 450 at the transition 452 near the base 442 is larger than the electron affinity of the base by $\Delta\chi^1$ and remains fixed until a transition 454, where it further increases by a value of $\Delta\chi^2$. For instance, a tunneling suppression layer constructed of a 10 nm thick layer of $Al_{0.35}Ga_{0.13}In_{0.52}As$ followed by a 15 nm thick layer of $Al_{0.32}Ga_{0.16}In_{0.52}As$ will produce the stepwise grading structure shown in FIG. 5C. Alternatively, compositions up to and including $Al_{0.26}Ga_{0.22}In_{0.52}As$, which would have approximately the same electron affinity as InP, may be used. In addition, the tunneling suppression layer could be formed using more than two transitions in which the electron affinity would increase from the base to the collector. The composition of the AlGaInAs can be $Al_{1-x-y}Ga_xIn_yAs$, where $0.09 \leq x \leq 0.25$, and y=0.52.

Alternatively, a tunneling suppression layer can be fabricated using a composition of AlInAsP formed by, for example, combining AlInAs and InP. A composition of AlInAsP that has the same electron affinity, $\chi$, as GaAsSb in the conduction band can be formed by combining 41% InP with 59% AlInAs. A step in the electron affinity of $\Delta\chi$=0.07 eV can be introduced by combining 70% InP with 30% AlInAs. The example is for AlInAs grown lattice matched to InP, which occurs using a composition of $Al_{0.48}In_{0.52}As$. For AlInAsP to have an electron affinity, $\chi$, greater than the electron affinity of GaAsSb in the conduction band, a higher InP fraction may be used, up to a composition of 100% InP. For example, a tunneling suppression layer having the grade shown in FIG. 5B may be formed by using a composition of InAlAsP having 58% InP and 42% InAlAs near the base and 75% InP and 25% InAlAs near the collector, and linearly interpolating in between. This would result in $\Delta\chi$=0.04 eV and $\Delta\chi^r$=0.04 eV.

In an alternative embodiment, the tunneling suppression layer may be formed of a composite referred to as a "digital alloy." A tunneling suppression layer of AlGaInAs can be formed of a digital alloy by, for example, forming thin layers of AlInAs alternating with thin layers of GaInAs. The layers can be formed using a thickness of a few monolayers. For example, a tunneling suppression layer of $A_{0.33}Ga_{0.15}In_{0.52}As$, can be formed using alternating layers of $Al_{0.48}In_{0.52}As$ and $Ga_{0.47}In_{0.53}As$. Alternative composites, such as aluminum indium arsenide phosphide (AlInAsP) comprising alternating layers of aluminum indium arsenide (AlInAs) and indium phosphide (InP), can be formed depending on the desired characteristics of the tunneling suppression layer.

Figure 6:
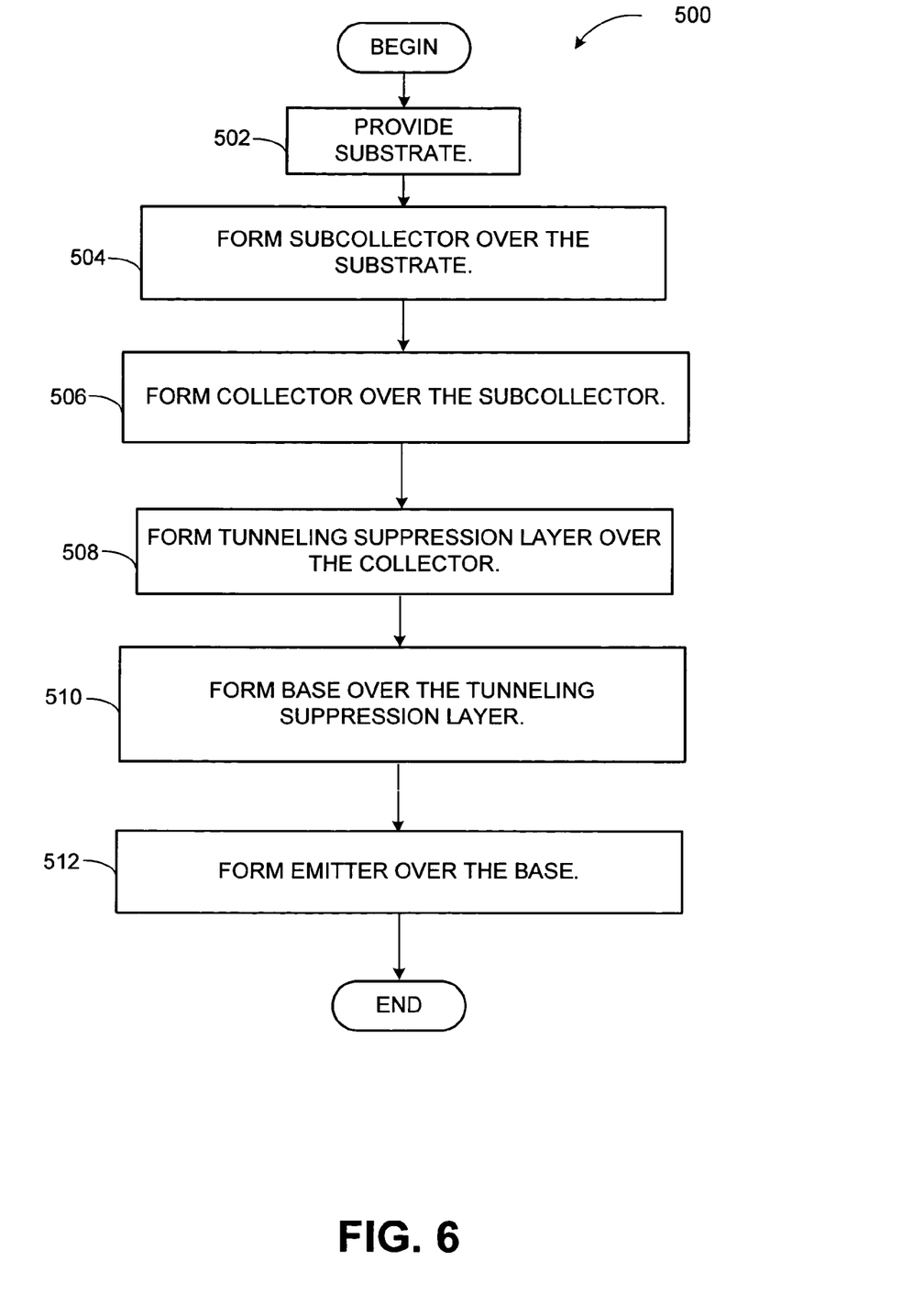
FIG. 6 is a flowchart describing the construction of an HBT in accordance with an embodiment of the invention.

FIG. 6 is a flowchart describing a method of constructing an HBT in accordance with an embodiment of the invention. In block 502 a substrate of indium phosphide is provided. In block 504 a subcollector layer of indium phosphide is formed. In block 506 a collector layer of indium phosphide is formed. In block 508 a tunneling suppression layer is formed. The tunneling suppression layer can be formed using aluminum gallium indium phosphide, aluminum indium arsenide phosphide, or a combination of two or more of aluminum, gallium, indium, nitrogen, phosphorous, arsenic and antimony. In block 510 a base layer of gallium arsenide antimonide is formed. In block 512 an emitter layer of indium phosphide is formed. The emitter may also contain two or more of aluminum, gallium, nitrogen, arsenic and antimony.

This disclosure describes the invention in detail using illustrative embodiments. However, it is to be understood that the invention defined by the appended claims is not limited to the precise embodiments described.

We claim:

1. A heterojunction bipolar transistor (HBT), comprising:
a collector formed over a substrate;
a base formed over the collector;
an emitter formed over the base; and a tunneling suppression layer between the collector and the base, the tunneling suppression layer fabricated from a material that is different from a material of the base and that has an electron affinity equal to or greater than an electron affinity of the material of the base, in which the collector comprises indium phosphide, the base comprises gallium arsenide antimonide, the emitter comprises two or more of indium, phosphorous, aluminum, gallium, nitrogen and arsenic, and the tunneling suppression layer comprises aluminum, gallium indium arsenide having the composition $Al_{0.33}Ga_{0.15}In_{0.52}As$.

2. A heterojunction bipolar transistor (HBT), comprising:

a collector formed over a substrate;

a base formed over the collector;

an emitter formed over the base; and a tunneling suppression layer between the collector and the base, the tunneling suppression layer fabricated from a material that is different from a material of the base and that has an electron affinity equal to or greater than an electron affinity of the material of the base, in which the collector comprises indium phosphide, the base comprises gallium arsenide antimonide, the emitter comprises two or more of indium, phosphorous, aluminum, gallium, nitrogen and arsenic, and the tunneling suppression layer comprises aluminum indium arsenide phosphide.

3. The HBT of claim 2, in which the tunneling suppression layer comprises indium phosphide and aluminum indium arsenide having between 40% and 100% indium phosphide.

4. The HBT of claim 3, in which the tunneling suppression layer comprises indium phosphide and aluminum indium arsenide having 58% indium phosphide and 42% aluminum indium arsenide near the base and 75% indium phosphide and 25% aluminum indium arsenide near the collector.

5. A heterojunction bipolar transistor (HBT), comprising:

a collector formed over a substrate;

a base formed over the collector;

an emitter formed over the base; and a tunneling suppression layer between the collector and the base, the tunneling suppression layer fabricated from a material that is different from a material of the base and that has an electron affinity equal to or greater than an electron affinity of the material of the base, in which the collector comprises indium phosphide, the base comprises gallium arsenide antimonide, the emitter comprises two or more of indium, phosphorous, aluminum, gallium, nitrogen and arsenic, and the tunneling suppression layer is formed of a digital alloy composite comprising aluminum gallium indium arsenide.

6. The HBT of claim 5, in which the digital alloy composite comprises $Al_{0.33}Ga_{0.15}In_{0.52}As$, using alternating layers of $Al_{0.48}In_{0.52}As$ and $Ga_{0.47}In_{0.53}As$.

7. A method of making a heterojunction bipolar transistor, the method comprising:

providing a substrate;

forming a subcollector over the substrate;

forming a collector over the subcollector;

forming a tunneling suppression layer over the collector;

forming a base over the tunneling suppression layer; and forming an emitter over the base, wherein the tunneling suppression layer is formed using a material that is different from a material of the base and that has an electron affinity equal to or greater than an electron affinity of the material of the base, further comprising forming the collector using indium phosphide, forming the base using gallium arsenide antimonide, forming the emitter using a material comprising two or more of indium, phosphorous, aluminum, gallium, nitrogen and arsenic, and forming the tunneling suppression layer using aluminum indium arsenide phosphide.

8. The method of claim 7, in which forming the tunneling suppression layer comprises forming the tunneling suppression layer with a graded electron affinity, $\chi$.

9. The method of claim 7, further comprising forming the tunneling suppression layer using indium phosphide and aluminum indium arsenide having 40% to 100% indium phosphide.

10. The method of claim 9, in which the tunneling suppression layer comprises indium phosphide and aluminum indium arsenide having 58% indium phosphide and 42% aluminum indium arsenide near the base and 75% indium phosphide and 25% aluminum indium arsenide near the collector.

11. A method of making a heterojunction bipolar transistor, the method comprising:

providing a substrate;

forming a subcollector over the substrate;

forming a collector over the subcollector;

forming a tunneling suppression layer over the collector;

forming a base over the tunneling suppression layer;

forming an emitter over the base, wherein the tunneling suppression layer is formed using a material that is different from a material of the base and that has an electron affinity equal to or greater than an electron affinity of the material of the base; and forming the collector using indium phosphide, forming the base using gallium arsenide antimonide, forming the emitter using a material comprising two or more of indium, phosphorous, aluminum, gallium, nitrogen and arsenic, and forming the tunneling suppression layer using a digital alloy composite comprising aluminum gallium indium arsenide.

12. The method of claim 11, further comprising forming the digital alloy composite using alternating layers of $Al_{0.48}In_{0.52}As$ and $Ga_{0.47}In_{0.53}$.

13. A tunneling suppression layer, comprising $Al_{0.33}Ga_{0.15}In_{0.52}As$.

* * * * *